United States Patent [19]
Molee

[11] 3,956,036
[45] May 11, 1976

[54] METHOD OF DIFFUSING SILICON SLICES WITH DOPANT AT HIGH TEMPERATURES

[75] Inventor: Casper S. Molee, Bloomfield, N.J.

[73] Assignee: Victory Engineering Corporation, Springfield, N.J.

[22] Filed: Feb. 10, 1975

[21] Appl. No.: 548,358

[52] U.S. Cl. .............................. 148/188; 148/190
[51] Int. Cl.² .......................................... H01L 7/34
[58] Field of Search ............................ 148/188, 190

[56] References Cited
UNITED STATES PATENTS

| | | | |
|---|---|---|---|
| 2,804,405 | 8/1957 | Derick et al. .................. | 148/187 X |
| 3,183,130 | 5/1965 | Reynolds et al. .................. | 148/188 |
| 3,615,944 | 10/1971 | Sheng et al. .................. | 148/189 |

Primary Examiner—G. Ozaki

[57] ABSTRACT

A method of applying a boron dopant to silicon slices which comprises applying a dopant solution to the faces of each slice, packing a plurality of slices adjoining each other in a quartz boat and inserting the boat slowly into a tubular furnace. The boron surface of each slice is covered with alumina powder to eliminate sticking. After heating at 1350° Celsius for four hours the slices are slowly pulled out of furnace.

8 Claims, 5 Drawing Figures

METHOD OF DIFFUSING SILICON SLICES WITH DOPANT AT HIGH TEMPERATURES

BACKGROUND OF THE INVENTION

Doping of silicon crystal slices is old in the art and many types of furnaces have been used to diffuse the dopant material into the crystal surface. Generally, the slices were first coated with a solution or mixture containing the dopant material and then, the slices were spread on a tray and placed in a furnace where they were subjected to a heating, cooling cycle involving many hours at a high temperature. Such a procedure is subject to several problems, such as; (1) warpage of slices due to change in thermal conditions, (2) autodoping between slices, and (3) the proper maintenance of surface concentration of dopant material. Also, only a few slices can be accommodated on each furnace tray, thereby severely limiting the number of slices per furnace cycle.

The present invention avoids many of the disadvantges and limitations of prior art methods. A tubular furnace is used and its central temperature can be kept at the maximum doping value. All the slices are stacked, surface-to-surface in a quartz boat after the dopant material has been added, and then the boat is slowly pushed into the high temperature zone where the diffusion takes place. The stack of slices is clamped together to eliminate both warpage and autodoping between slices. The furnace is small compared to prior art furnaces and several hundred slices can be accommodated in a single small boat.

SUMMARY

The invention includes a method of diffusing crystal silicon slices with doping material to control the electrical characteristics of the silicon to make them suitable for subsequent passage of electrical current. The method includes the steps of applying doping material to the surfaces of all the slices to be diffused; stacking the slices under pressure in a quartz boat with the doping material surfaces adjoining each other; and slowly moving the boat and slices into a tubular furnace to increase the temperature of the slices at a predetermined rate. After a set time in a high temperature doping zone where the dopant material is diffused into the silicon surface, the boat and slices are slowly withdrawn from the furnace.

One of the features of the invention is the use of aluminum oxide powder spread on the dopant to prevent the slices from sticking to each other.

Another feature of the invention is the use of a clamping means to press the slices together while in the furnace to avoid buckling or warping.

Another feature of the invention is the use of face-to-face contact while in the diffusing step to avoid transfer of doping material from one slice to another.

Additional details of the invention will be disclosed in the following description, taken in connection with the accompanying drawing.

DESCRIPTION OF THE PREFERRED EMBODIMENT

Figure 1:
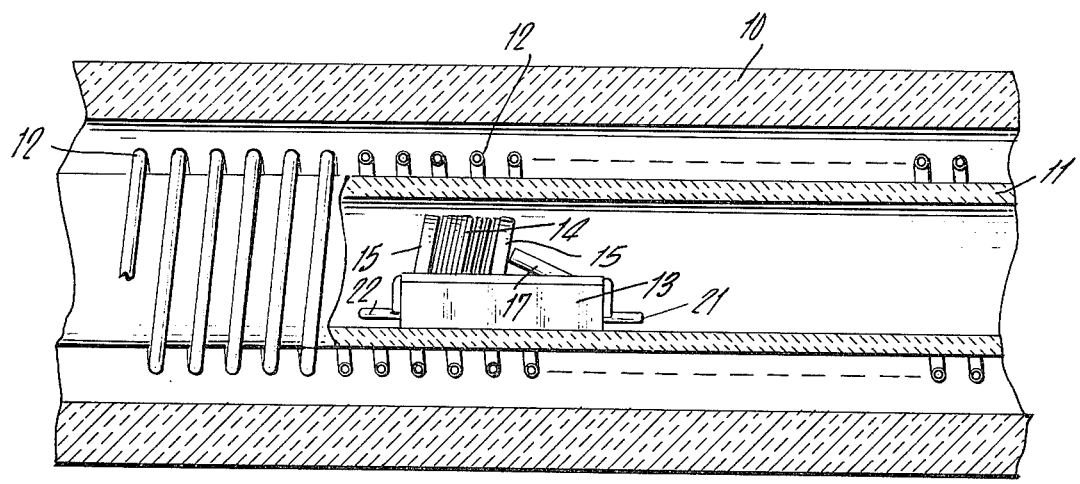
FIG. 1 is a longitudinal cross sectional view of the tubular furnace with a boat and slices in the central position.
Figure 2:
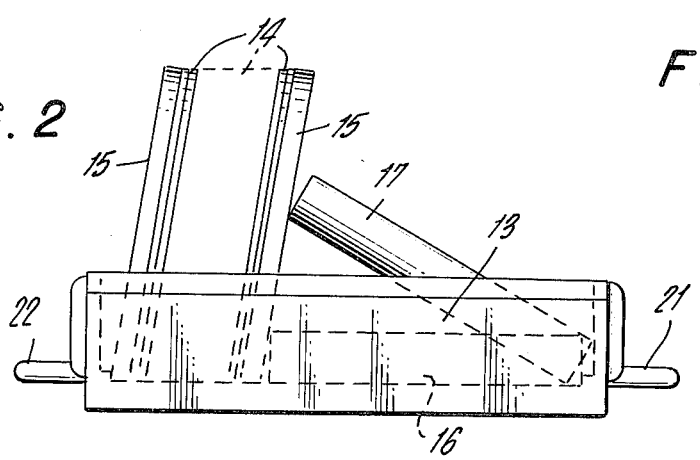
FIG. 2 is a side view, drawn to an enlarged scale, of the boat and slices.
Figure 3:
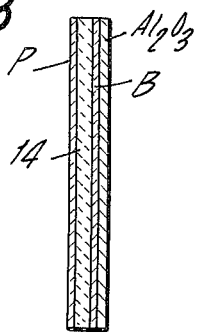
FIG. 3 is a side view of one of the slices showing the applied films.

Referring to the drawing, FIG. 1 shows parts of a tubular furnace enclosed in a tubular heat shield 10. Inside the shield is a tubular furnace wall 11 made of mullite, an orthorhombic silicate of aluminum and available commercially from the Carborundum Co. of Niagara Falls, N. Y. The mullite is selected over quartz because of its greater stability at the high temperature used (1350°c) in the diffusion process. A coil of heater resistance wire 12 is wound around the mullite tube and connected to a conventional electrical power source (not shown) for applying current to the coil to maintain the temperature within the wall 11 at a constant temperature of 1350°C. Suitable temperature regulating means, well known in the art, are used to maintain the predetermined temperature at a value plus or minus 1°.

Figure 4:
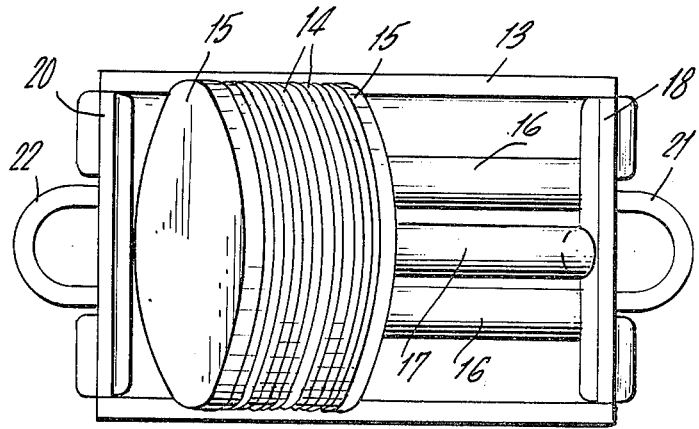
FIG. 4 is a top view of the boat, slices, and clamping means.
Figure 5:
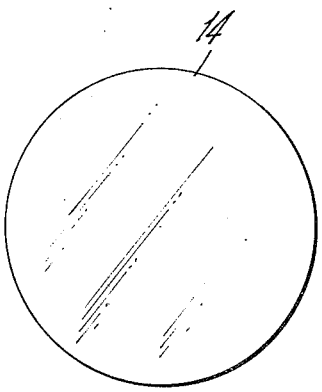
FIG. 5 is a plan view of one of the slices.

Within the furnace tube 11 is shown a boat 13 of quartz carrying a plurality of silicon slices 14. The silicon slices are stacked between two slabs 15 of fire brick to maintain the slices in a flat configuration during the heating and cooling periods, and three quartz rods 16 and 17 (see FIG. 4) are used to hold the slabs 15 and slices under moderate clamping pressure. Rods 16 are positioned on the bottom of the boat's interior, while rod 17 is disposed at an angle between one end of the boat 13 and the side of one of the fire bricks. The preferred arrangement comprises lengths of rods 16 and 17 which will give a tilt of 10° to the stack. The optimum tilt of 10 – 15° is required to allow a uniform movement of heated air to envelop the silicon slices.

The quartz boat 13 is provided with reinforced end walls 18,20 and two curved handles 21,22. The handles are used to insert and withdraw the boat from the furnace tube 11.

OPERATION

The slices of silicon are first doped by using a paint-on technique and then dried. On one surface of each slice, phosphorus is added so that there are $2. \times 10^{21}$ atoms per sq. cm. over the slice area. The other side of the slice is covered with a solution or mixture containing boron so that, when dried there will be $1. \times 10^{19}$ atoms per sq. cm. over the other slice area. A spinner may be used to spread the solution and if this is done, four drops of each dopant are used for each side and the spinner is modified by placing circular plastic inserts around the spinner edge to prevent splash back of the dopant liquid onto the reverse side of the slice.

Drying of the dopant liquid can be done by subjecting the slices to the radiation of an infrared lamp for five minutes or they may be air dried for 15 minutes (at 25°c). After drying, the other sides of the slices are coated in the same manner. Next, the boron surface of each slice is coated with about 2.0 grams of alumina powder ($Al_2O_3$) and stacked so that the boron side of one slice faces a corresponding boron side of the next slice. It is possible to stack one hundred slices in this manner. Care must be taken to insure that the slices are evenly stacked and their edges in alignment, otherwise autodoping will result. The use of alumina powder is to prevent the slices from adhering to each other at the diffusion temperature.

The stacked slices are placed between the two fire brick disks 15 and placed into the carrier boat 13. Two quartz rods 16 are cut to length and placed in the bottom of the boat to hold the lower edge of the fire brick in place. A third quartz rod 17 is used as a prop to engage the central portion of the fire brick and hold it at an angle of about 10° from the vertical. This arrangement puts a moderate pressure on the stack of slices and insures that they will not separate when heated to the required temperature of 1350°c. If the slices are allowed to separate, the slices may warp and there may be autodoping from slice to slice.

At the start of the diffusion cycle, the carrier boat with the slices is placed at the entrance of the diffusion furnace and allowed to presoak at 325°C for about 10 minutes. Then, using a manual push rod (not shown) or a mechanically operated pusher, the boat and stack of slices is pushed into the diffusion zone (1350°c) at the rate of one-half inch (12.7 m.m.) per minute. This slow rate has been found to be satisfactory and any marked increase in this speed will cause the slices to warp. After admission to the hot diffusion zone, the boat and slices remain in the zone for four hours, and are then withdrawn at one-half inch (12.7mm) per minute until the entrance is again reached. The boat and slices are left at the entrance position for ten minutes prior to removing them to the room environment.

From the above description of the apparatus and the operation of doping it will be evident that the invention provides a procedure wherein (1) a large number of silicon slices can be doped in a short time cycle. (2) No special atmosphere is required within the furnace or carrier boat. (3) There is no autodoping from one slice to another. (4) There is no warping of slices. And, (5) the surface concentration of the dopant material is maintained so that the resultant devices posess electrical characteristics which are constant over the entire slice surface.

Having thus fully described the invention, what is claimed as new and desired to be secured by Letters Patent of the United States is:

1. A method of diffusing a plurality of crystal silicon slices with doping material to control the electrical characteristics of the silicon for subsequent passage of electrical current, said method including the application of doping material to the surface of all the slices; stacking the slices under pressure with the doping material surfaces adjoining each other in a refractory boat; slowly moving the boat and the stacked slices into a furnace to increase the temperature of the slices at a predetermined rate; maintaining the boat and slices in a doping zone at a diffusion temperature of the order of 1350° celsius for a predetermined time interval to diffuse the dopant into the slice surface; and withdrawing the boat and slices slowly from the doping zone to a lower temperature zone at a predetermined speed.

2. A method as defined in claim 1 wherein the slices are made of silicon.

3. A method as defined in claim 1 wherein one of the doping materials is a mixture containing boron and is applied with a concentration of $1.0 \times 10^{19}$ atoms per sp. cm.

4. A method as defined in claim 3 wherein a layer of aluminum oxide granules is placed on the boron surface to prevent sticking during the heating cycle.

5. A method as defined in claim 1 wherein doping material is added to both sides of the slices before moving the boat in the furnace.

6. A method as defined in claim 5 wherein the dopant material on the other side of the slice contains phosphorus.

7. A method as defined in claim 6 wherein the phosphorus is applied in a concentration of $2.0 \times 10^{21}$ atoms per sq. cm.

8. A method according to claim 1 in which the slices are stacked at a tilt of from 10° to 15°.

* * * * *